United States Patent
Yamada et al.

(10) Patent No.: US 12,009,450 B2
(45) Date of Patent: Jun. 11, 2024

(54) OPTICAL RECEIVING ELEMENT AND MANUFACTURING METHOD THEREFOR

(71) Applicant: Nippon Telegraph and Telephone Corporation, Tokyo (JP)

(72) Inventors: Yuki Yamada, Tokyo (JP); Masahiro Nada, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 135 days.

(21) Appl. No.: 17/776,367

(22) PCT Filed: Nov. 18, 2019

(86) PCT No.: PCT/JP2019/045059
§ 371 (c)(1),
(2) Date: May 12, 2022

(87) PCT Pub. No.: WO2021/100082
PCT Pub. Date: May 27, 2021

(65) Prior Publication Data
US 2022/0399471 A1    Dec. 15, 2022

(51) Int. Cl.
*H01L 31/107* (2006.01)
*H01L 31/0232* (2014.01)
(Continued)

(52) U.S. Cl.
CPC .... *H01L 31/1075* (2013.01); *H01L 31/02327* (2013.01); *H01L 31/03046* (2013.01); *H01L 31/1844* (2013.01); *H01L 31/1892* (2013.01)

(58) Field of Classification Search
CPC ........... H01L 31/1075; H01L 31/02327; H01L 31/03046; H01L 31/1844; H01L 31/1892; H01L 31/022416; H01L 31/035281
See application file for complete search history.

(56) References Cited

U.S. PATENT DOCUMENTS

| 6,350,998 B1 * | 2/2002 | Tsuji | H01L 31/03046 257/190 |
| 2003/0178636 A1 * | 9/2003 | Kwan | H01L 31/107 257/190 |

(Continued)

FOREIGN PATENT DOCUMENTS

| CN | 106784132 B * | 9/2018 | ..... H01L 31/035272 |
| JP | 2005086109 A | 3/2005 | |

(Continued)

OTHER PUBLICATIONS

Hirota et al., "Reliable non-Zn-diffused InP/InGaAs avalanche photodiode with buried n—InP layer operated by electron injection mode", Electronics Letters, Oct. 14, 2004, vol. 40, No. 21, 2 pages.

(Continued)

*Primary Examiner* — Sitaramarao S Yechuri
(74) *Attorney, Agent, or Firm* — SLATER MATSIL, LLP

(57) ABSTRACT

A first n-type contact layer, a second n-type contact layer, a multiplication layer, an electric field control layer, a light absorbing layer, and a p-type contact layer are layered in this order on a substrate. The second n-type contact layer is formed between the first n-type contact layer and the light absorbing layer, is made to have an area smaller than that of the light absorbing layer in a plan view, and is disposed inside the light absorbing layer in a plan view.

8 Claims, 7 Drawing Sheets

(51) Int. Cl.
*H01L 31/0304* (2006.01)
*H01L 31/18* (2006.01)

(56) References Cited

U.S. PATENT DOCUMENTS

| | | | | |
|---|---|---|---|---|
| 2003/0226952 | A1* | 12/2003 | Clark | H01L 31/022408 250/214.1 |
| 2009/0101919 | A1* | 4/2009 | Yao | H01L 27/14603 257/85 |
| 2010/0163925 | A1 | 7/2010 | Ishibashi et al. | |
| 2011/0073762 | A1 | 3/2011 | Soma et al. | |
| 2018/0294301 | A1* | 10/2018 | Wei | H01L 27/14678 |
| 2020/0259038 | A1 | 8/2020 | Natsuaki et al. | |

FOREIGN PATENT DOCUMENTS

| | | |
|---|---|---|
| JP | 2007005697 A | 1/2007 |
| JP | 2011077165 A | 4/2011 |
| JP | 2011187607 A | 9/2011 |
| JP | 2015177167 A | 10/2015 |
| JP | 2015201504 A | 11/2015 |
| JP | 201632034 A | 3/2016 |
| WO | 2017094277 A1 | 6/2017 |

OTHER PUBLICATIONS

Liu et al., "4H—SiC PIN Recessed-Window Avalanche Photodiode With High Quantum Efficiency", IEEE Photonics Technology Letters, vol. 20, No. 18, Sep. 15, 2008, pp. 1551-1553.

Nada, et al., "Inverted InAlAs/InGaAs Avalanche Photodiode with LowHigh Low Electric Field Profile", Japanese Journal of Applied Physics 51, Feb. 20, 2012, 4 pages.

Yagyu et al., "Recent Advances in AlInsAs Avalanche Photodiodes", 2007 Conference on Optical Fiber Communication and the National Fiber Optic Engineers Conference, OThG2, 2007, 3 pages.

* cited by examiner

OPTICAL RECEIVING ELEMENT AND MANUFACTURING METHOD THEREFOR

CROSS-REFERENCE TO RELATED APPLICATIONS

This application is a national phase entry of PCT Application No. PCT/JP2019/045059, filed on Nov. 18, 2019, which application is hereby incorporated herein by reference.

TECHNICAL FIELD

The present invention relates to a light receiving element and a method for producing the light receiving element.

BACKGROUND

A light receiving element is an element that plays a role in converting optical signals propagating in optical fibers into electrical signals in optical communications. Along with an increased communication capacity in a data center or the like in recent years, an increase in transmission capacity of an optical fiber communication system is required, and a high speed property is required for a light receiving element used in the optical fiber communication system. As a high-speed semiconductor light receiving element, there are mainly a PIN photodiode (PIN-PD) and an avalanche photodiode (APD). Among these, in the avalanche photodiode, the element itself has a signal amplification function, and the avalanche photodiode is widely used as a light receiving element having a sensitivity higher than that of the PIN photodiode.

In the avalanche photodiode for optical communication, an element having a structure in which an n-type contact layer, a multiplication layer, an electric field control layer, a light absorbing layer, and a p-type contact layer are layered in this order on an InP substrate is common (NPL 1). In this element, the light absorbing layer is composed of InGaAs having a large light absorption coefficient in a communication wavelength band (1.55 μm or 1.3 μm). In addition, the multiplication layer in which a high electric field is generated is composed of InP or the like having a band gap greater than that of InGaAs. Furthermore, in this element, the electric field control layer that has been p-type doped is used for generating an electric field having a higher intensity in the multiplication layer than that in the light absorbing layer.

In the meantime, with this type of element, leakage current during operation is problematic. For example, an operating voltage is higher in the avalanche photodiode than in the PIN-PD, and thus, high leakage current is likely to occur during operation, leading to reduced reliability and deterioration in SN. In particular, an electric field generated at an element side surface of the avalanche photodiode leads to surface leakage current. In order to suppress the surface leakage current, it is important in the design of the light receiving element to suppress an electric field intensity of the element side surface, and in particular, it is essential in the design of avalanche photodiodes.

In order to solve these problems, there has been proposed a(n) (electric field constriction) structure in which impurities are introduced locally, such as in a center portion of an element in a plan view, by a production technique such as ion implantation, regrowth, or selective diffusion to form a conductive layer, thereby confining an electric field inside the element (see NPL 1 and NPL 2). However, with these production techniques, it is difficult to control diffusion of the introduced impurities, so that an electric field constriction region varies within a wafer surface and hinders miniaturization necessary for high-speed operation.

For the electric field constriction structure by impurity introduction described above, there has been proposed an inverted avalanche photodiode structure in which a mesa structure is formed using a production technique of lithography etching to generate electric field constriction (PTL 1, NPL 3). This inverted avalanche photodiode will be described with reference to FIG. 4.

The avalanche photodiode includes a p-type contact layer 302, a light absorbing layer 303, an electric field control layer 304, a multiplication layer 305, and an n-type contact layer 306 on a substrate 301 composed of In having high resistance. The n-type contact layer 306 is formed having a smaller area than a mesa constituted by the light absorbing layer 303, the electric field control layer 304, and the multiplication layer 305 in a plan view.

The p-type contact layer 302 is composed of InGaAsP, for example, in which p-type impurities are introduced in a higher concentration, and the light absorbing layer 303 is composed of InGaAs. The electric field control layer 304 is composed of InP, the multiplication layer 305 is composed of InP, and the n-type contact layer 306 is composed of InGaAsP in which n-type impurities are introduced in a higher concentration.

In addition, an n-type electrode 311 formed in an annular shape in a plan view is formed on the n-type contact layer 306. The n-type electrode 311 is composed of an electrode material such as Ti/Au. A p-type electrode 312 is formed on the p-type contact layer 302 around the light absorbing layer 303. The p-type electrode 312 is composed of an electrode material such as Pt/Ti/Au, for example. A reflection layer 321 is formed on the n-type contact layer 306 inside the n-type electrode 311.

In the element structure described above, the electric field intensities in the light absorbing layer 303 and the multiplication layer 305 exposed on the element side surface are lower than that inside the element, so that surface leakage current can be suppressed. In order to suppress edge breakdown in the multiplication layer 305 due to an edge electric field by the n-type contact layer 306, it has also been proposed to use an edge electric field relaxation layer and an n-type electric field control layer (PTL 1, NPL 3).

Here, a light receiving sensitivity of the light receiving element is determined by an absorption coefficient of a material composing the light absorbing layer 303 and a distance (optical path length) by which light passes through the light absorbing layer 303. As described above, when the reflection layer 321 is provided on an upper portion of the element, it is possible to increase the optical path length, thereby improving the light receiving sensitivity (NPL3). In the light receiving element described above, light incident on a side of the substrate 301 is reflected by the reflection layer 321 after passing through the light absorbing layer 303, and passes through the light absorbing layer 303 again. In this way, when the reflection layer 321 is provided, the optical path length increases, so that the light receiving sensitivity can be improved.

In the meantime, the reflection layer 321 is composed of Au, for example, so as to obtain a high reflectance. In addition, the n-type electrode 311 is formed in an annular shape surrounding the reflection layer 321, is constituted by a layered structure such as Ti/Pt/Au from the perspective of heat resistance and adhesion to obtain an ohmic connection with the n-type contact layer 306, and has a reflectance of light smaller than that of the reflection layer 321.

In contrast to the above-mentioned light receiving sensitivity, a response rate of this type of light receiving element is determined by an element capacity, an element resistance, and a traveling time of a carrier. Accordingly, in order to operate the light receiving element at a higher speed, it is conceivable to reduce an operating area of the element and reduce the element capacity.

CITATION LIST

Patent Literature

PTL 1: JP 2015-177167 A

Non Patent Literature

NPL 1: Y. Hirota et al., "Reliable non-Zn-diffused InP/InGaAs avalanche photodiode with buried n-InP layer operated by electron injection mode", Electronics Letters, vol. 40, no. 21, pp. 1378-1388, 2004.
NPL 2: E. Yagyu et al., "Recent Advances in AlInsAs Avalanche Photodiodes", 2007 Conference on Optical Fiber Communication and the National Fiber Optic Engineers Conference, OThG2, 2007.
NPL 3: M. Nada et al., "Inverted InAlAs/InGaAs Avalanche Photodiode with Low-High-Low Electric Field Profile", Japanese Journal of Applied Physics, vol. 51, 02BG03, 2012.

SUMMARY

Technical Problem

In the light receiving element in the related art as described above, in order to reduce an operating area of the element for speeding up, for example, an area of the n-type contact layer in a plan view needs to be reduced, but in this case, an area of the reflection layer or the n-type electrode is reduced. When the area of the n-type electrode is reduced, a production margin in a lithographic process for electrode formation becomes small, and a contact resistance between the n-type electrode and the n-type contact layer is increased. Accordingly, there is a limit in reducing the area of the electrode. In order to reduce the area of the n-type contact layer without reducing the area of the electrode, the area of the reflection layer is reduced. However, reduction in area of the reflection layer results in reduction in effective area of a light receiving portion.

For example, when a diameter of the n-type contact layer formed in a circular shape (true circle) in a plan view is 10 μm, assuming that a width of the n-type electrode formed in an annular shape is 2 μm, a radius of the reflection layer having a circular shape in a plan view is up to 6 μm. Thus, in this case, a light receiving diameter is up to 6 μm. In this way, in order to achieve optical coupling with low loss even for a light receiving element having a small light receiving area, there is a technique in which, when light is incident on the light receiving element, a lens is used to focus the incident light to achieve optical coupling with low loss, as is well known. However, for practical use, a spot size of incident light can only be reduced to approximately 10 μm even with a lens. As a result, incident light leaks from the light receiving range to decrease a light receiving sensitivity.

As a method for reducing the operating area without reducing the light receiving area, it is conceivable to form the n-type electrode and the reflection layer on the n-type contact layer, and then to make the area of the n-type contact layer smaller. Such processing of the n-type contact layer is generally performed by a method in which an undercut is made in the n-type contact layer using etching from a side by a wet etching method. Here, for example, in an avalanche photodiode, in order to avoid edge breakdown, it is desirable to form a mesa structure of layers in a circular shape in a plan view. However, etching from a side by wet etching as described above is affected by crystal anisotropy of a compound semiconductor, so that it is not easy to make the shape in a plan view circular.

As described above, there has been a problem in that when the operating area is reduced in order to achieve higher speed operation of the light receiving element, the light receiving area is reduced, leading to a reduction in light receiving sensitivity.

Embodiments of the present invention have been contrived to solve the above-described problem, and an object thereof is to make it possible to improve an operating speed of a light receiving element without causing reduction in light receiving area.

Means for Solving the Problem

A light receiving element according to embodiments of the present invention includes: a first n-type contact layer formed on a substrate and composed of an n-type semiconductor; a light absorbing layer formed on the first n-type contact layer and composed of a semiconductor; a p-type contact layer formed on the light absorbing layer and composed of a p-type semiconductor; a second n-type contact layer formed between the first n-type contact layer and the light absorbing layer and composed of an n-type semiconductor, the second n-type contact layer having an area smaller than an area of the light absorbing layer in a plan view and being disposed inside the light absorbing layer in a plan view; a first electrode formed on the p-type contact layer; and a second electrode formed on the first n-type contact layer around a region where the second n-type contact layer is formed.

Further, a method for producing a light receiving element according to embodiments of the present invention includes: a first step of forming a first n-type contact layer composed of an n-type semiconductor on a substrate; a second step of forming, on another substrate, a p-type contact layer composed of a p-type semiconductor, a light absorbing layer composed of a semiconductor, and a second semiconductor layer composed of an n-type semiconductor in this order; a third step of patterning the semiconductor layer to a predetermined area in a plan view to form a second n-type contact layer; a fourth step of bonding the substrate and the other substrate such that a side on which the first n-type contact layer is formed and a side on which the second n-type contact layer is formed face to each other; a fifth step of removing the other substrate after bonding the substrate and the other substrate such that the first n-type contact layer, the second n-type contact layer, the light absorbing layer, and the p-type contact layer are layered in this order on the substrate; a sixth step of patterning the light absorbing layer and the p-type contact layer to make an area of each of the light absorbing layer and the p-type contact layer larger than an area of the second n-type contact layer in a plan view such that the second n-type contact layer is disposed inside the light absorbing layer in a plan view; and a seventh step of forming a first electrode on the p-type contact layer and forming a second electrode on the first n-type contact layer around a region where the second n-type contact layer is formed.

Effects of Embodiments of the Invention

As described above, according to embodiments of the present invention, the second n-type contact layer composed of an n-type semiconductor is provided between the first n-type contact layer and the light absorbing layer, and the second n-type contact layer has an area smaller than that of the light absorbing layer in a plan view and is disposed inside the light absorbing layer in a plan view, so that it is possible to improve the operating speed of the light receiving element without causing a reduction in light receiving area.

DETAILED DESCRIPTION OF ILLUSTRATIVE EMBODIMENTS

Hereinafter, light receiving elements according to embodiments of the present invention will be described.

First Embodiment

Figure 1:
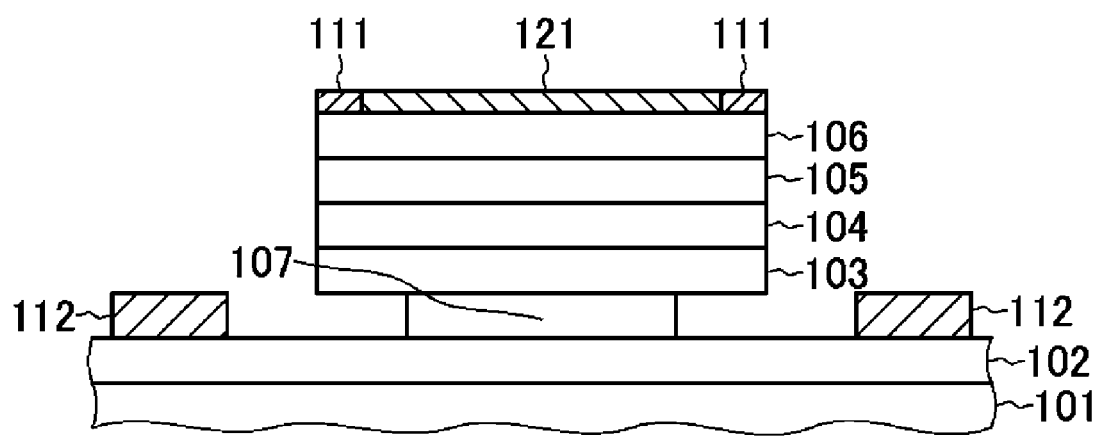
FIG. 1 is a cross-sectional view illustrating a configuration of a light receiving element according to a first embodiment of the present invention.

First, a light receiving element according to a first embodiment of the present invention will be described with reference to FIG. 1. In the light receiving element, a first n-type contact layer 102, a second n-type contact layer 107, a multiplication layer 103, an electric field control layer 104, a light absorbing layer 105, and a p-type contact layer 106 are layered in this order on a substrate 101. The light receiving element according to the first embodiment is a well-known avalanche photodiode.

The substrate 101 is composed of, for example, a semi-insulating single crystal of InP having a high resistance by Fe doping. The substrate 101 may also be composed of a semiconductor such as SiC having a thermal conductivity higher than that of InP.

The first n-type contact layer 102 is composed of, for example, a Group III to V compound semiconductor such as InGaAsP, which is made n-type by introducing n-type impurities in a high concentration. The first n-type contact layer 102 may also be composed of SiC that is made n-type.

The light absorbing layer 105 is composed of a Group III to V compound semiconductor having a band gap energy corresponding to a wavelength of light of interest, for example, InGaAs. The p-type contact layer 106 is formed on the light absorbing layer 105. In this example, the p-type contact layer 106 has the same area (planar shape) as that of the light absorbing layer 105 in a plan view. The p-type contact layer 106 is composed of, for example, a Group III to V compound semiconductor such as InGaAsP, which is made p-type by introducing a high concentration of p-type impurities.

As described above, the multiplication layer 103 is formed between the second n-type contact layer 107 and the light absorbing layer 105. In this example, the multiplication layer 103 has the same area (planar shape) as that of the light absorbing layer 105 in a plan view. The multiplication layer 103 is composed of a Group III to V compound semiconductor such as InP. The electric field control layer 104 is formed between the multiplication layer 103 and the light absorbing layer 105. In this example, the electric field control layer 104 has the same area (planar shape) as that of the light absorbing layer 105 in a plan view. The electric field control layer 104 is composed of a Group III to V compound semiconductor such as InP.

Note that each of the p-type contact layer 106, the multiplication layer 103, and the electric field control layer 104 does not need to have the same area (planar shape) as that of the light absorbing layer 105, but as described in the production method below, these layers are generally formed in the same mesa, and as a result, these layers have the same area. In other words, a configuration in which the p-type contact layer 106, the multiplication layer 103, and the electric field control layer 104 have the same area (planar shape) as that of the light absorbing layer 105 in a plan view facilitates production of the element.

The second n-type contact layer 107 is formed between the first n-type contact layer 102 and the light absorbing layer 105, has an area smaller than that of the light absorbing layer 105 in a plan view, and is disposed inside the light absorbing layer 105 in a plan view. In addition, the second n-type contact layer 107 has an area smaller than that of the first n-type contact layer 102 in a plan view, and is disposed inside the first n-type contact layer 102. In the first embodiment, electric field constriction is achieved by the second n-type contact layer 107 having an area smaller than those of the other layers in a plan view. The second n-type contact layer 107 is composed of, for example, a Group III to V compound semiconductor such as InGaAsP, which is made n-type by introducing n-type impurities in a high concentration. The second n-type contact layer 107 may also be composed of SiC that is made n-type.

Each layer composed of a Group III to V compound semiconductor described above may be a layer in lattice match with InP. Note that, of course, the layers other than the light absorbing layer 105 are each composed of a semiconductor having a band gap energy different from that of the semiconductor composing the light absorbing layer 105. The electric field control layer 104 is composed of a semiconductor having a band gap energy greater than that of the semiconductor composing the light absorbing layer 105.

Note that the second n-type contact layer 107, the multiplication layer 103, the electric field control layer 104, the light absorbing layer 105, and the p-type contact layer 106 are each patterned into a predetermined shape, and are formed into, for example, a well-known mesa structure. For example, the multiplication layer 103, the electric field control layer 104, the light absorbing layer 105, and the p-type contact layer 106 are formed into a first mesa having a cylindrical shape with a true circle cross section, and the second n-type contact layer 107 is formed into a second mesa having a cylindrical shape with a true circle cross section having a diameter smaller than that of the first mesa. In addition, the second mesa is disposed inside the first mesa in a plan view. Further, a center axis in a normal direction of a substrate plane of the first mesa is a center axis in a normal direction of a substrate plane of the second mesa.

The light receiving element according to the first embodiment includes a first electrode in formed on the p-type contact layer 106, and a second electrode 112 formed on the first n-type contact layer 102. The first electrode 111 is formed in, for example, an annular shape (ring shape), and is formed in a peripheral edge portion on the p-type contact layer 106. The first electrode 111 is, for example, a four-layer laminate structure of a platinum layer/titanium layer/platinum layer/gold layer, and is in ohmic connection with the p-type contact layer 106. The second electrode 112 is, for example, a three-layer laminate structure of a titanium layer/platinum layer/gold layer, and is in ohmic connection with the first n-type contact layer 102 composed of a Group III to V compound semiconductor such as InGaAsP. In addition, when the first n-type contact layer 102 is composed of SiC, the second electrode 112 can have a two-layer laminate structure of, for example, a nickel layer/gold layer.

The light receiving element according to the first embodiment includes a reflection layer 121 formed on the p-type contact layer 106. The reflection layer 121 has an area smaller than that of the p-type contact layer 106 in a plan view, and is disposed inside the p-type contact layer 106 in a plan view. The first electrode 111 is formed on the p-type contact layer 106 around the reflection layer 121. The reflection layer 121 can be composed of gold, for example.

In the light receiving element according to the first embodiment, light incident on the side of the substrate 101 passes through the light absorbing layer 105, is reflected by the reflection layer 121, and passes through the light absorbing layer 105 again. When light passes through the light absorbing layer 105, holes and electrons are generated by photoexcitation in the light absorbing layer 105. The holes generated in the light absorbing layer 105 reach the p-type contact layer 106 to be relaxed, and are taken out of the first electrode 111. Furthermore, the electrons generated in the light absorbing layer 105 reach the second n-type contact layer 107 (the first n-type contact layer 102) to be relaxed, and are taken out of the second electrode 112.

In such a light receiving operation, an element capacity is determined by an area of the second n-type contact layer 107 in a plan view, the second n-type contact layer 107 realizing electric field constriction. In contrast, a region where the first electrode 111 is not formed (region where the reflection layer 121 is formed) related to a light receiving area is determined by an area of the p-type contact layer 106 in a plan view, and is not related to an area of the second n-type contact layer 107. In other words, the area of the second n-type contact layer 107 can be reduced for electric field constriction, and at the same time, the area of the p-type contact layer 106 can be made larger in order to increase the light receiving area.

For example, it can be set such that the second n-type contact layer 107 having a circular shape (true circle) in a plan view has a diameter of 10 μm, the p-type contact layer 106 having a circular shape (true circle) in a plan view has a diameter of 14 μm, and the first electrode 111 having an annular shape formed in a peripheral edge portion on the p-type contact layer 106 has a width of 2 μm in a plan view. In this case, a light receiving diameter is 10 μm. When an electrode is formed on a layer with a small area due to electric field constriction, if the electrode has a width of 2 μm, the light receiving diameter becomes 10−2×2=6 μm, but in contrast to this, a larger diameter can be achieved. As a result, a problem such as leakage of incident light from the light receiving range can be greatly suppressed.

In the meantime, in this type of light receiving element, there is parasitic resistance caused by sheet resistance between the operating region in which the electric field is constricted and the electrode. This parasitic resistance is larger in the p-type contact layer because a resistivity of the p-type semiconductor is greater than that of the n-type semiconductor by about one digit. In the light receiving element according to the first embodiment, the first electrode 111 can be formed on the p-type contact layer 106 without being significantly separated from the operating region in which the electric field is constricted, so that the parasitic resistance does not become so high.

Furthermore, in the light receiving element, the element diameter is reduced for speeding up, which leads to an increase in current density during operation, leading to an increase in amount of heat generated in the multiplication layer 103. This heat generated in the multiplication layer 103 is dissipated outside the element, for example, to a heat sink connected to the substrate 101, via the second n-type contact layer 107, the first n-type contact layer 102, and the substrate 101.

Accordingly, when the substrate 101 is composed of a semiconductor such as SiC having a thermal conductivity higher than that of InP, heat dissipation efficiency can be improved. In addition, when the first n-type contact layer 102 is composed of SiC, the heat dissipation efficiency described above can be further improved. Furthermore, in addition to these, when the second n-type contact layer 107 is also composed of SiC, the heat dissipation efficiency described above can be even further improved.

For example, in the light receiving element according to the first embodiment, when the element diameter is 10 μm, in a case where the second n-type contact layer 107, the first n-type contact layer 102, and the substrate 101 are composed of an InP-based Group III to V compound semiconductor, thermal resistance estimated in a region from the second n-type contact layer 107 to the substrate 101 is 2600 K/W. Note that the substrate 101 has a thickness of 100 μm, the first n-type contact layer 102 has a thickness of 100 nm, and the second n-type contact layer 107 has a thickness of 40 nm. In addition, the thermal resistance was calculated assuming that the thermal conductivity of InP was 68 W/mK, and the thermal conductivity of InGaAsP was to W/mK (see Reference 1). In this case, a temperature increase in the multiplication layer 103 estimated during operation at 20 V and 1 mA is 52° C.

In contrast, when the substrate 101 and the first n-type contact layer 102 are composed of SiC, the thermal resistance estimated in the region from the second n-type contact layer 107 to the substrate 101 is 670 K/W. Note that the thermal conductivity of SiC is assumed to be 370 W/mK. In this case, the temperature increase in the multiplication layer 103 estimated during operation at 20 V and 1 mA is 13° C., and it is possible to suppress temperature increase.

Furthermore, when the substrate 101, the first n-type contact layer 102, and the second n-type contact layer 107 are composed of SiC, the thermal resistance estimated in the region from the second n-type contact layer 107 to the substrate 101 is 160 K/W. In this case, the temperature increase in the multiplication layer 103 estimated during operation at 20 V and 1 mA is 3.3° C., and it is possible to further suppress temperature increase.

Note that when the second n-type contact layer 107 is composed of SiC, there is an offset of approximately 0.5 eV in the conduction band between the multiplication layer 103 composed of InP and the second n-type contact layer 107. However, a width of a potential barrier is thin, electrons can tunnel to pass through the potential barrier, and it is thus believed that an influence on sensitivity by this offset is negligible. For example, when it is assumed that an impurity concentration of the multiplication layer 103 is $1 \times 10^{16}$ cm$^{-3}$ and an impurity concentration (doping concentration) of the second n-type contact layer 107 is $1 \times 10^{19}$ cm$^{-3}$, the width of the potential barrier is estimated to be 1 nm or less.

Although as to materials of the layers, description has been given using SiC for the substrate 101, the substrate 101 may be composed of another material having a high thermal conductivity, such as diamond, AlN, or Si. The p-type contact layer 106, the first n-type contact layer 102, and the second n-type contact layer 107 may be composed of InAlGaAs, InP, InGaAs, or the like. The multiplication layer 103 may be composed of InAlAs. In addition, an insulating layer composed of SiN, SiO$_2$, or the like may be disposed between the reflection layer 121 and the p-type contact layer 106 in order to improve adhesion.

Furthermore, it is in a scope of general device design to insert an edge electric field relaxation layer, an electric field control layer that is made n-type, or the like between the multiplication layer 103 and the second n-type contact layer 107 to suppress edge breakdown.

Figure 2A:
FIG. 2A is a cross-sectional view illustrating a configuration of an element in an intermediate step for describing a method for producing the light receiving element according to the first embodiment of the present invention.

Hereinafter, a method for producing the light receiving element according to the first embodiment will be described with reference to FIGS. 2A to 2D. First, as illustrated in FIG. 2A, the first n-type contact layer 102 is formed on the substrate 101 (first step). For example, a known metal-organic chemical vapor deposition (MOCVD) method is used to grow a semiconductor, so that the first n-type contact layer 102 can be formed.

Figure 2B:
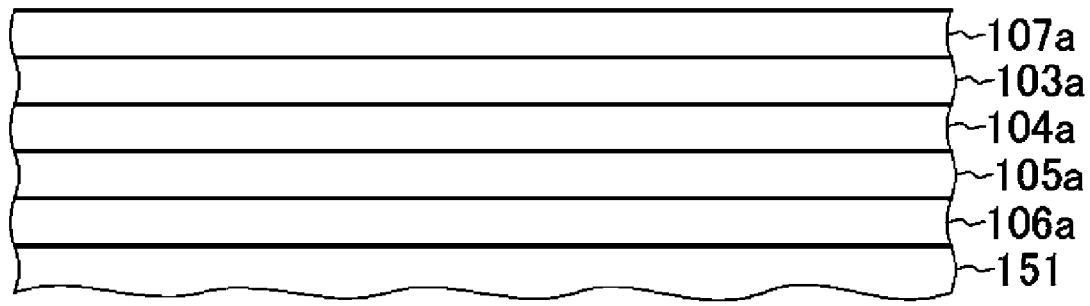
FIG. 2B is a cross-sectional view illustrating a configuration of the element in an intermediate step for describing the method for producing the light receiving element according to the first embodiment of the present invention.
Figure 2C:
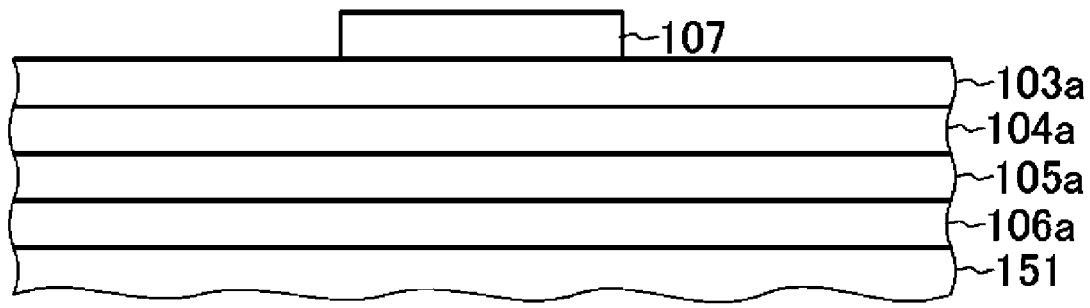
FIG. 2C is a cross-sectional view illustrating a configuration of the element in an intermediate step for describing the method for producing the light receiving element according to the first embodiment of the present invention.

Furthermore, another substrate 151 is prepared, and as illustrated in FIG. 2B, a p-type contact layer 106a composed of a p-type semiconductor, a light absorbing layer 105a, an electric field control layer 104a, a multiplication layer 103a, and a semiconductor layer 107a composed of an n-type semiconductor are formed in this order on the other substrate 151 (second step). The semiconductor layer 107a is a layer that is made into the second n-type contact layer 107. Next, the semiconductor layer 107a is patterned to a predetermined area in a plan view to form the second n-type contact layer 107, as illustrated in FIG. 2C (third step). For example, the semiconductor layer 107a is selectively etched by a known dry etching technique using a mask pattern formed by a well-known photolithography technique, so that the second mesa of the second n-type contact layer 107 can be formed. After the second n-type contact layer 107, the mask pattern is removed.

Figure 2D:
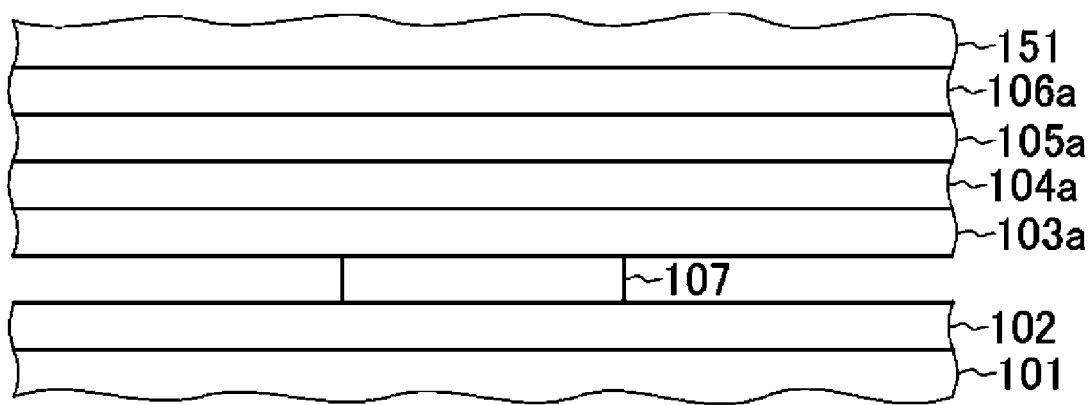
FIG. 2D is a cross-sectional view illustrating a configuration of the element in an intermediate step for describing the method for producing the light receiving element according to the first embodiment of the present invention.

Next, as illustrated in FIG. 2D, the substrate 101 and the other substrate 151 are bonded to each other in a state where the side on which the first n-type contact layer 102 is formed and the side on which the second n-type contact layer 107 is formed face each other (fourth step). For example, a surface activation treatment of each of bonding surfaces of the first n-type contact layer 102 and the second n-type contact layer 107 is performed using argon beam to perform the bonding (see Reference 2).

After the substrate 101 and the other substrate 151 are bonded to each other as described above, the other substrate 151 is removed to make a state where the first n-type contact layer 102, the second n-type contact layer 107, the multiplication layer 103a, the electric field control layer 104a, the light absorbing layer 105a, and the p-type contact layer 106a are layered in this order on the substrate 1o1 (fifth step). For example, the other substrate 151 can be removed by a well-known polishing technique and an etching technique.

Next, the multiplication layer 103a, the electric field control layer 104a, the light absorbing layer 105a, and the p-type contact layer 106a are patterned to form a predetermined mesa shape (sixth step). For example, the above-described layers are etched by a known dry etching technique using a mask pattern formed by a well-known photolithography technique, so that the above-described first mesa can be formed. In this first mesa, the light absorbing layer 105, the electric field control layer 104, the light absorbing layer 105, and the p-type contact layer 106 are layered in this order from the substrate 101 side. In this step, the first mesa is set to have an area larger than that of the second mesa of the second n-type contact layer 107 in a plan view. A specific value of the area is arbitrary. This step makes a state where the second n-type contact layer 107 is disposed inside the light absorbing layer 105 in a plan view.

According to the production method described above, the shape (mesa shape) of the second n-type contact layer 107 in a plan view can be controlled by the lithographic technique and the etching technique currently commonly used in production of semiconductor apparatuses. Accordingly, it is possible to control the operating area defined by the second n-type contact layer 107 with high accuracy. In addition, it is possible to fabricate a light receiving element in which each mesa is of any shape, such as a circular shape in a plan view.

Next, the first electrode 111 is formed on the p-type contact layer 106, and the second electrode 112 is formed on the first n-type contact layer 102 around the region where the light absorbing layer 105 is formed (seventh step). Furthermore, the reflection layer 121 is formed on the p-type contact layer 106, the reflection layer 121 having an area smaller than that of the p-type contact layer 106 in a plan view and being disposed inside the p-type contact layer 106 in a plan view (eighth step). A state where the first electrode 111 is formed on the p-type contact layer 106 around the reflection layer 121 is made. The first electrode in, the second electrode 112, and the reflection layer 121 can be formed by, for example, metal deposition using a well-known vapor deposition method and patterning using a lift-off method.

Second Embodiment

Figure 3:
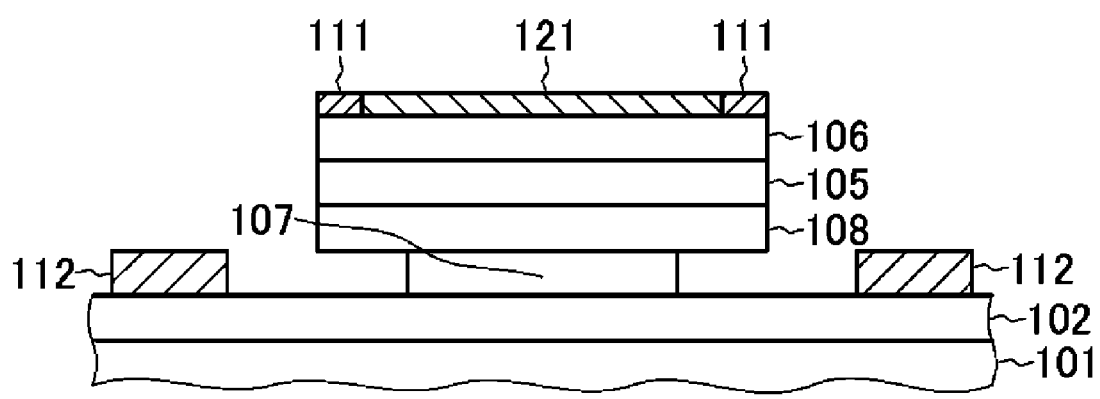
FIG. 3 is a cross-sectional view illustrating a configuration of a light receiving element according to a second embodiment of the present invention.
Figure 4:
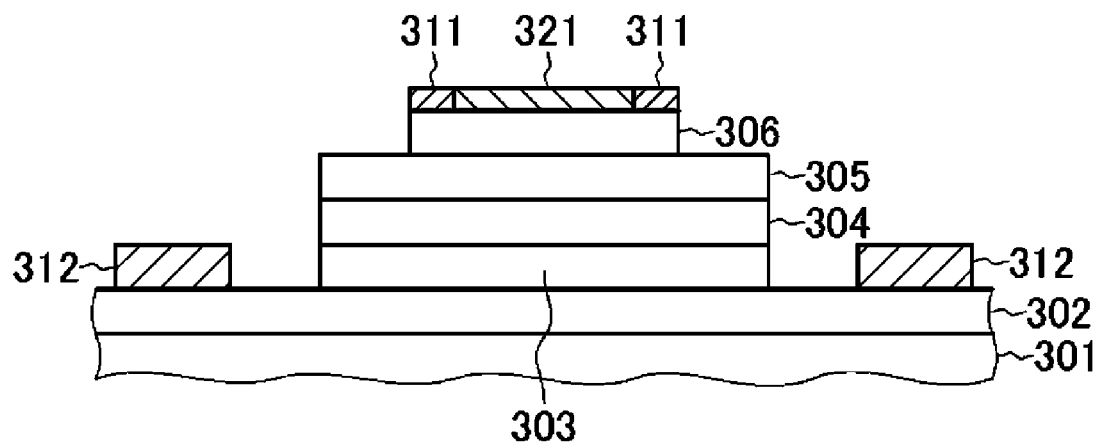
FIG. 4 is a cross-sectional view illustrating a configuration of an inverted avalanche photodiode.

Next, a light receiving element according to a second embodiment of the present invention will be described with reference to FIG. 3. In the light receiving element, a first n-type contact layer 102, a second n-type contact layer 107, a traveling layer 108, a light absorbing layer 105, and a p-type contact layer 106 are layered in this order on a substrate 101. The light receiving element according to the second embodiment is a well-known PIN photodiode (PIN-PD).

The substrate 101 is composed of, for example, a semi-insulating single crystal of InP having a high resistance by Fe doping. The substrate 101 may also be composed of a semiconductor such as SiC having a thermal conductivity higher than that of InP.

The first n-type contact layer 102 is composed of, for example, SiC that is made n-type. Note that the first n-type contact layer 102 may be composed of a Group III to V compound semiconductor such as InGaAsP.

The light absorbing layer 105 is composed of a Group III to V compound semiconductor having a band gap energy corresponding to a wavelength of light of interest, for example, InGaAs. The p-type contact layer 106 is formed on the light absorbing layer 105. The p-type contact layer 106 is composed of, for example, a Group III to V compound semiconductor such as InGaAsP, which is made p-type by introducing a high concentration of p-type impurities. The light absorbing layer 105 and the p-type contact layer 106 are the same as those of the above-described first embodiment.

The traveling layer 108 is formed between the second n-type contact layer 107 and the light absorbing layer 105. In addition, the traveling layer 108 has the same area (planar shape) as that of the light absorbing layer 105 in a plan view. The traveling layer 108 is composed of, for example, a Group III to V compound semiconductor such as InP. Here, as is well known, the traveling layer 108 is a layer used for improving the operating speed of the light receiving element, it is important to deplete the traveling layer 108 during operation, and the traveling layer 108 is composed of a substantially i-type semiconductor.

Note that the traveling layer 108 is similar to the multiplication layer 103 and the electric field control layer 104 in the first embodiment described above, and does not need to have the same area (planar shape) as that of the light absorbing layer 105, but in general, the layers are formed into an identical mesa, as a result of which the layers have the same area (planar shape). In other words, a configuration in which each of the p-type contact layer 106 and the traveling layer 108 has the same area (planar shape) as that of the light absorbing layer 105 in a plan view facilitates production of the element.

The second n-type contact layer 107 is formed between the first n-type contact layer 102 and the light absorbing layer 105, has an area smaller than that of the light absorbing layer 105 in a plan view, and is disposed inside the light absorbing layer 105 in a plan view. In addition, the second n-type contact layer 107 has an area smaller than that of the first n-type contact layer 102 in a plan view, and is disposed inside the first n-type contact layer 102.

In the second embodiment, electric field constriction is achieved by the second n-type contact layer 107 having an area smaller than those of the other layers in a plan view. The second n-type contact layer 107 is composed of SiC that is made n-type. Note that the second n-type contact layer 107 may be composed of a Group III to V compound semiconductor such as InGaAsP, for example.

Each layer composed of a Group III to V compound semiconductor described above may be a layer in lattice match with InP. Note that, of course, the layers other than the light absorbing layer 105 are each composed of a semiconductor having a band gap energy different from that of the semiconductor composing the light absorbing layer 105.

Note that the light receiving element according to the second embodiment also includes the first electrode in formed on the p-type contact layer 106 and the second electrode 112 formed on the first n-type contact layer 102, similarly to the first embodiment described above. The first electrode 111 is formed in, for example, an annular shape (ring shape), and is formed in a peripheral edge portion on the p-type contact layer 106. In addition, the light receiving element includes the reflection layer 121 formed on the p-type contact layer 106.

A method for producing the light receiving element according to the second embodiment will be described briefly. First, as in the first embodiment described above, the first n-type contact layer 102 is formed on the substrate 101 (first step). Next, another substrate is prepared, and the p-type contact layer 106 composed of a p-type semiconductor, a light absorbing layer 105, and a traveling layer 108 are formed in this order on the other substrate. Furthermore, a semiconductor layer composed of SiC is formed on the traveling layer 108 (second step). The semiconductor layer is a layer that is made into the second n-type contact layer 107. Next, as in the first embodiment described above, a semiconductor layer 107a is patterned to a predetermined area in a plan view to form the second n-type contact layer 107 (third step).

Next, the substrate 101 and the other substrate are bonded to each other in a state where the side on which the first n-type contact layer 102 is formed and the side on which the second n-type contact layer 107 is formed face each other (fourth step). In this manner, after the substrate 101 and the other substrate are bonded to each other, the other substrate is removed to make a state where the first n-type contact layer 102, the second n-type contact layer 107, the traveling layer 108, the light absorbing layer 105, and the p-type contact layer 106 are layered in this order on the substrate 101 (fifth step).

Next, the traveling layer 108, the light absorbing layer 105, and the p-type contact layer 106 are patterned to form a predetermined mesa shape (sixth step). In this step, the first mesa formed of the traveling layer 108, the light absorbing layer 105, and the p-type contact layer 106 is made to have an area larger than that of the second mesa of the second n-type contact layer 107 in a plan view. A specific value of the area is arbitrary. This step makes a state where the second n-type contact layer 107 is disposed inside the light absorbing layer 105 in a plan view.

Next, the first electrode 111 is formed on the p-type contact layer 106, and the second electrode 112 is formed on the first n-type contact layer 102 around the region where the light absorbing layer 105 is formed (seventh step). Furthermore, the reflection layer 121 is formed on the p-type contact layer 106, the reflection layer 121 having an area smaller than that of the p-type contact layer 106 in a plan view and being disposed inside the p-type contact layer 106 in a plan view (eighth step). A state where the first electrode 111 is formed on the p-type contact layer 106 around the reflection layer 121 is made.

In the light receiving element according to the second embodiment, light incident on the side of the substrate 101 passes through the light absorbing layer 105 and, is reflected by the reflection layer 121, and passes through the light absorbing layer 105 again. When light passes through the light absorbing layer 105, holes and electrons are generated by photoexcitation in the light absorbing layer 105. The holes generated in the light absorbing layer 105 reach the p-type contact layer 106 to be relaxed, and are taken out of the first electrode 111. Furthermore, the electrons generated in the light absorbing layer 105 reach the second n-type contact layer 107 (the first n-type contact layer 102) to be relaxed, and are taken out of the second electrode 112.

In such a light receiving operation, an element capacity is determined by an area of the second n-type contact layer 107 in a plan view, the second n-type contact layer 107 realizing electric field constriction. In contrast, a region where the first electrode 111 is not formed (region where the reflection layer 121 is formed) related to a light receiving area is determined by an area of the p-type contact layer 106 in a plan view, and is not related to an area of the second n-type contact layer 107. In other words, the area of the second n-type contact layer 107 can be reduced for electric field constriction, and at the same time, the area of the p-type contact layer 106 can be made larger in order to increase the light receiving area.

For example, it can be set such that the second n-type contact layer 107 having a circular shape (true circle) in a plan view has a diameter of 10 μm, the p-type contact layer 106 having a circular shape (true circle) in a plan view has a diameter of 14 μm, and the first electrode 111 having an annular shape formed in a peripheral edge portion on the p-type contact layer 106 has a width of 2 μm in a plan view. In this case, a light receiving diameter is 10 μm. When an electrode is formed on a layer with a small area due to electric field constriction, if the electrode has a width of 2 μm, the light receiving diameter becomes 10−2×2=6 μm, but in contrast to this, a larger diameter can be achieved. As a result, a problem such as leakage of incident light from the light receiving range can be greatly suppressed.

As described above, according to embodiments of the present invention, the second n-type contact layer composed of an n-type semiconductor is provided between the first n-type contact layer and the light absorbing layer, and the second n-type contact layer has an area smaller than that of the light absorbing layer in a plan view and is disposed inside the light absorbing layer in a plan view, so that the operating speed of the light receiving element can be improved without causing a reduction in light receiving area.

Meanwhile, the present invention is not limited to the embodiments described above, and it will be obvious to those skilled in the art that various modifications and combinations can be implemented within the technical idea of the present invention.

REFERENCE

Reference 1: F. N. Masana, "Thermal characterisation of power modules", Microelectronics Reliability, vol. 40, pp. 155-161, 2000.
Reference 2: H. Takagi et al., "Surface activated bonding of silicon wafers at room temperature", Applied Physics Letters, vol. 68, no. 16, pp. 2222-2224, 1996.

REFERENCE SIGNS LIST

101 . . . Substrate
102 . . . First n-type contact layer
103 . . . Multiplication layer
104 . . . Electric field control layer
105 . . . Light absorbing layer
106 . . . P-type contact layer
107 . . . Second n-type contact layer
108 . . . Traveling layer
111 . . . First electrode
112 . . . Second electrode
121 . . . Reflection layer.

The invention claimed is:

1. A light receiving element, comprising:
a first n-type contact layer on a substrate, the first n-type contact layer being composed of a first n-type semiconductor;
a light absorbing layer on the first n-type contact layer, the light absorbing layer being composed of a first semiconductor;
a p-type contact layer on the light absorbing layer, the p-type contact layer being composed of a p-type semiconductor;
a second n-type contact layer between the first n-type contact layer and the light absorbing layer, the second n-type contact layer being composed of a second n-type semiconductor, the second n-type contact layer having an area smaller than an area of the light absorbing layer in a plan view, the second n-type contact layer overlapping the light absorbing layer in the plan view;
a first electrode on the p-type contact layer;
a second electrode on the first n-type contact layer around a region of the second n-type contact layer; and
a reflection layer formed on the p-type contact layer, the reflection layer having an area smaller than an area of the p-type contact layer in the plan view and being disposed inside the p-type contact layer in the plan view, wherein the first electrode is disposed on the p-type contact layer around the reflection layer.

2. The light receiving element according to claim 1, further comprising:
a multiplication layer between the second n-type contact layer and the light absorbing layer, the multiplication layer being composed of a second semiconductor; and
an electric field control layer between the multiplication layer and the light absorbing layer, the electric field control layer being composed of a third semiconductor.

3. The light receiving element according to claim 1, wherein the substrate is composed of a fourth semiconductor having a thermal conductivity higher than a thermal conductivity of InP.

4. A method for producing a light receiving element, the method comprising:
forming a first n-type contact layer composed of a first n-type semiconductor on a substrate;
forming, on another substrate, a p-type contact layer composed of a p-type semiconductor, a light absorbing layer composed of a first semiconductor, and a semiconductor layer composed of a second n-type semiconductor in this order;
patterning the semiconductor layer to a predetermined area in a plan view to form a second n-type contact layer;
bonding the substrate and the other substrate such that a side on which the first n-type contact layer is formed and a side on which the second n-type contact layer faces each other;
removing the other substrate after the substrate and the other substrate are bonded to each other to layer the first n-type contact layer, the second n-type contact layer, the light absorbing layer, and the p-type contact layer in this order on the substrate;
patterning the light absorbing layer and the p-type contact layer to make an area of each of the light absorbing layer and the p-type contact layer larger than the area of the second n-type contact layer in the plan view such that the second n-type contact layer is disposed inside the light absorbing layer in the plan view;
forming a first electrode on the p-type contact layer;
forming a second electrode on the first n-type contact layer around a region where the second n-type contact layer is formed; and
forming a reflection layer on the p-type contact layer, the reflection layer having an area smaller than an area of the p-type contact layer in the plan view and being disposed inside the p-type contact layer in the plan view, wherein the first electrode is disposed on the p-type contact layer around the reflection layer.

5. The method for producing a light receiving element according to claim 4, wherein:
in the forming of, on the other substrate, the p-type contact layer, the light absorbing layer, and the semiconductor layer in this order, the p-type contact layer, the light absorbing layer, an electric field control layer composed of a semiconductor, a multiplication layer composed of a semiconductor, and the semiconductor layer are formed in this order,
in the removing of the other substrate after the substrate and the other substrate are bonded to each other to layer the first n-type contact layer, the second n-type contact layer, the light absorbing layer, and the p-type contact layer in this order on the substrate, the first n-type contact layer, the second n-type contact layer, the multiplication layer, the electric field control layer, the light absorbing layer, and the p-type contact layer are layered in this order on the substrate, and
in the patterning of the light absorbing layer and the p-type contact layer to make the area of each of the light absorbing layer and the p-type contact layer larger than the area of the second n-type contact layer in the plan view such that the second n-type contact layer is disposed inside the light absorbing layer in the plan view, the multiplication layer, the electric field control layer, the light absorbing layer, and the p-type contact layer are patterned to make an area of each of the multiplication layer, the electric field control layer, the light absorbing layer, and the p-type contact layer larger than the area of the second n-type contact layer in the plan view, and the second n-type contact layer is disposed inside the light absorbing layer in the plan view.

6. The method for producing a light receiving element according to claim 4, wherein the substrate is composed of a semiconductor having a thermal conductivity higher than a thermal conductivity of InP.

7. A method for forming a light receiving element, the method comprising:
forming a first n-type contact layer comprising a first n-type semiconductor on a first substrate;
forming, on a second substrate, a p-type contact layer comprising of a p-type semiconductor, a light absorbing layer comprising of a first semiconductor, and a semiconductor layer comprising of a second n-type semiconductor in this order;
patterning the semiconductor layer to have a first area in a plan view to form a second n-type contact layer;
bonding the first substrate and the second substrate such that a side on which the first n-type contact layer is formed and a side on which the second n-type contact layer faces each other;
removing the second substrate after bonding the first substrate to the second substrate;
patterning the light absorbing layer and the p-type contact layer to make a second area of the light absorbing layer and a third area of the p-type contact layer larger than the first area of the second n-type contact layer in the plan view such that the second n-type contact layer overlaps the light absorbing layer in the plan view; and
forming a reflection layer on the p-type contact layer, the reflection layer having a fourth area smaller than the third area of the p-type contact layer in the plan view and overlapping the p-type contact layer in the plan view.

8. The method for producing a light receiving element according to claim 7, further comprising:
forming a first electrode on the p-type contact layer; and
forming a second electrode on the first n-type contact layer around a region where the second n-type contact layer is formed.

\* \* \* \* \*